United States Patent
Bayan et al.

(10) Patent No.: US 6,674,156 B1
(45) Date of Patent: Jan. 6, 2004

(54) MULTIPLE ROW FINE PITCH LEADLESS LEADFRAME PACKAGE WITH USE OF HALF-ETCH PROCESS

(75) Inventors: Jaime Bayan, Palo Alto, CA (US); Peter Howard Spalding, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 15 days.

(21) Appl. No.: 09/781,006

(22) Filed: Feb. 9, 2001

(51) Int. Cl.[7] .................. H01L 23/495; H01L 23/28
(52) U.S. Cl. .................. 257/670; 257/666; 257/669; 257/676; 257/670; 257/787
(58) Field of Search ................. 257/666, 670, 257/787, 669, 676

(56) References Cited

U.S. PATENT DOCUMENTS 5,654,585 A * 8/1997 Nishikawa .................. 257/666
6,008,528 A * 12/1999 Go et al. .................... 257/670
6,150,709 A * 11/2000 Shin et al. .................. 257/666
6,229,200 B1 * 5/2001 Mclellan et al. ............ 257/666
6,400,004 B1 * 6/2002 Fan et al. ................... 257/666

* cited by examiner

Primary Examiner—Eddie Lee
Assistant Examiner—Nitin Parekh
(74) Attorney, Agent, or Firm—Beyer Weaver & Thomas, LLP

(57) ABSTRACT

A leadless leadframe panel comprising a partially etched top surface of a substrate panel that forms recessed regions that define a portion of a first and a second set of tie bars and a portion of a first and second set of contact pads. A bottom surface of the panel forms lower recessed regions that define the remaining portion of the first and second set of tie bars and the remaining portion of the first and second set of contact pads. The resulting contact pads are connected to a respective one of the tie bars.

21 Claims, 4 Drawing Sheets

MULTIPLE ROW FINE PITCH LEADLESS LEADFRAME PACKAGE WITH USE OF HALF-ETCH PROCESS

FIELD OF THE INVENTION

The present invention relates generally to semiconductor packaging and more particularly to improved leadless leadframe based packaging.

BACKGROUND

A leadless leadframe package (LLP) is a relatively new integrated circuit package design that contemplates the use of a metal (typically copper) leadframe type substrate structure in the formation of the conductive elements of a package. FIG. 1A illustrates a top plan view of a copper leadframe strip or panel 101, which may be used to form leadless leadframe packages. FIG. 1B and 1C, each illustrate enlarged, top plan views of the leadframe strip 101. Referring to FIG. 1A, the copper leadframe strip 101 is patterned (typically by stamping or etching) to define a plurality of arrays 103 of chip substrate features. Referring to FIGS. 1B and 1C, each chip substrate feature includes a die attach pad 107 and a plurality of contacts 109 disposed about their associated die attach pad 107. Very fine tie bars 111 are used to support the die attach pads 107 and contacts 109.

During assembly, dice are attached to the respective die attach pads 107 and conventional wire bonding is used to electrically couple bond pads on each die to their associated contacts 109 on the leadframe strip 101. After the wire bonding, a plastic cap is molded over the top surface of the each array 103 of wire-bonded dice. The dice are then singulated and tested using conventional sawing and testing techniques. During singulation, the tie bars 111 are cut and therefore the only material holding the contacts 109 in place is the molding material. The resulting packaged chip can then be surface mounted on a printed circuit board or other substrate using conventional techniques.

Although leadless leadframe packaging has proven to be a cost-effective packaging arrangement, there are continuing efforts to further reduce the costs associated with packaging. Accordingly additional and improved leadless leadframe designs that are particularly well suited for use in relatively high pin count devices would be desirable.

SUMMARY

The present invention is directed towards a method of making a leadless leadframe panel through the technique of partial etching. The partial etching technique allows the tie bars, and the respective electrical contact pads, of the leadless leadframe to be placed in close proximity to each other. As a result, the packaged semiconductor devices formed from such leadless leadframes are able to have very fine pitch electrical contact pads. The method of the present invention involves partially etching a top surface of a substrate panel to form recessed regions that define a portion of a first and a second set of tie bars and a portion of a first and second set of contact pads. The method also involves partially etching a bottom surface of the panel to form lower recessed regions that define the remaining portion of the first and second set of tie bars and the remaining portion of the first and second set of contact pads. The resulting contact pads are connected to a respective one of the tie bars.

Another aspect of the invention is directed towards the leadless leadframe panel that results from the partial etching method. The leadless leadframe of the present invention includes a first and second set of tie bars and a first and second set of contact pads. The tie bars of the first and second set are formed in parallel formation wherein the tie bars of the first and second set are in an alternating formation. Each of the second set of tie bars has a thickness that is less than the thickness of the panel and the first and second set of tie bars are aligned with the top surface of the panel. The contact pads of the first and second set have contact surfaces that are coplanar with the bottom surface of said panel, and the maximum thickness of each of the first and second set of contact pads are equal to the thickness of the panel.

Another aspect of the invention is directed towards the leadless leadframe panel as described above with an additional feature of alternative bond surfaces. The alternative bonding surfaces are formed on the first and second set of tie bars between the respective first and second set of contact pads and a die attach pad. Each of the alternative bond surfaces have a thickness equal to the thickness of the panel so that the alternative bond surfaces are suitable for connection with one end of a bonding wire.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not be en described in detail in order to not unnecessarily obscure the present invention.

In general, the present invention pertains to forming leadless leadframe substrate panels having multiple rows of contact pads through the technique of partial etching. By partially etching the substrate panels, very small separation between each of the tie bars, which support the contact pads, may be achieved. Therefore, the present invention facilitates the manufacture of leadless leadframe packages having tightly spaced contact pads or pins. The method involves partially etching a top surface of a substrate panel to form recessed regions that define a portion of a first and a second set of tie bars and a portion of a first and second set of contact pads. The method also involves partially etching a bottom surface of the panel to form lower recessed regions that define the remaining portion of the first and second set of tie bars and the remaining portion of the first and second set of contact pads. The resulting contact pads are connected to a respective one of the tie bars.

Figure 1A:
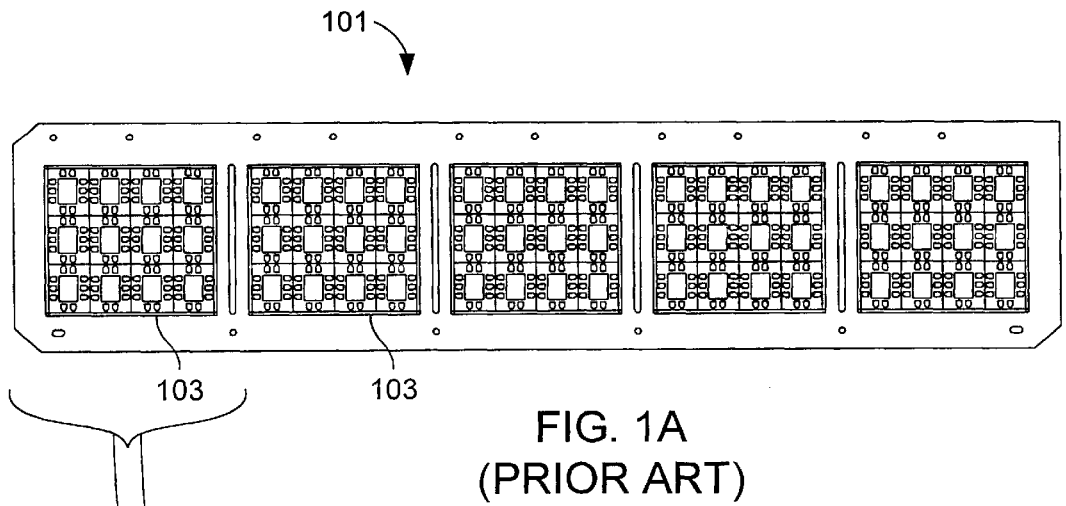
FIGS. 1A–1C illustrate successively enlarged, top plan views of a leadless leadframe substrate panel as is currently known in the art.
Figure 1B:
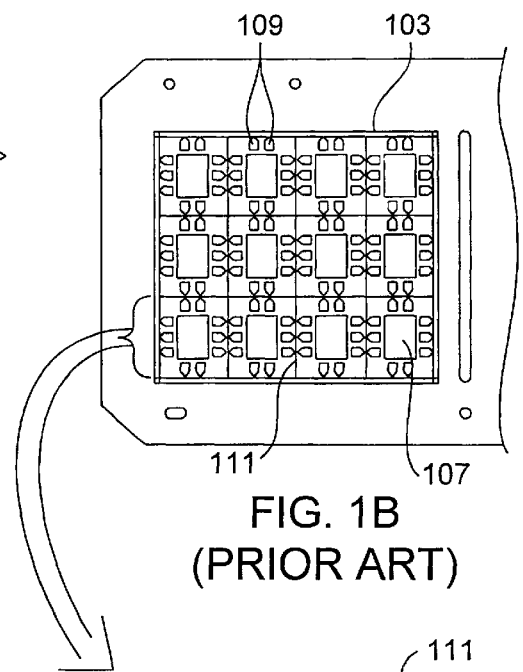
Figure 1C:
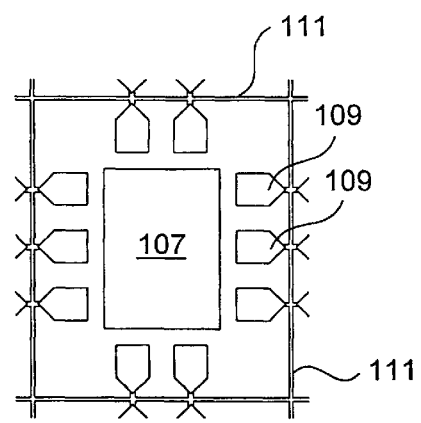
Figure 2A:
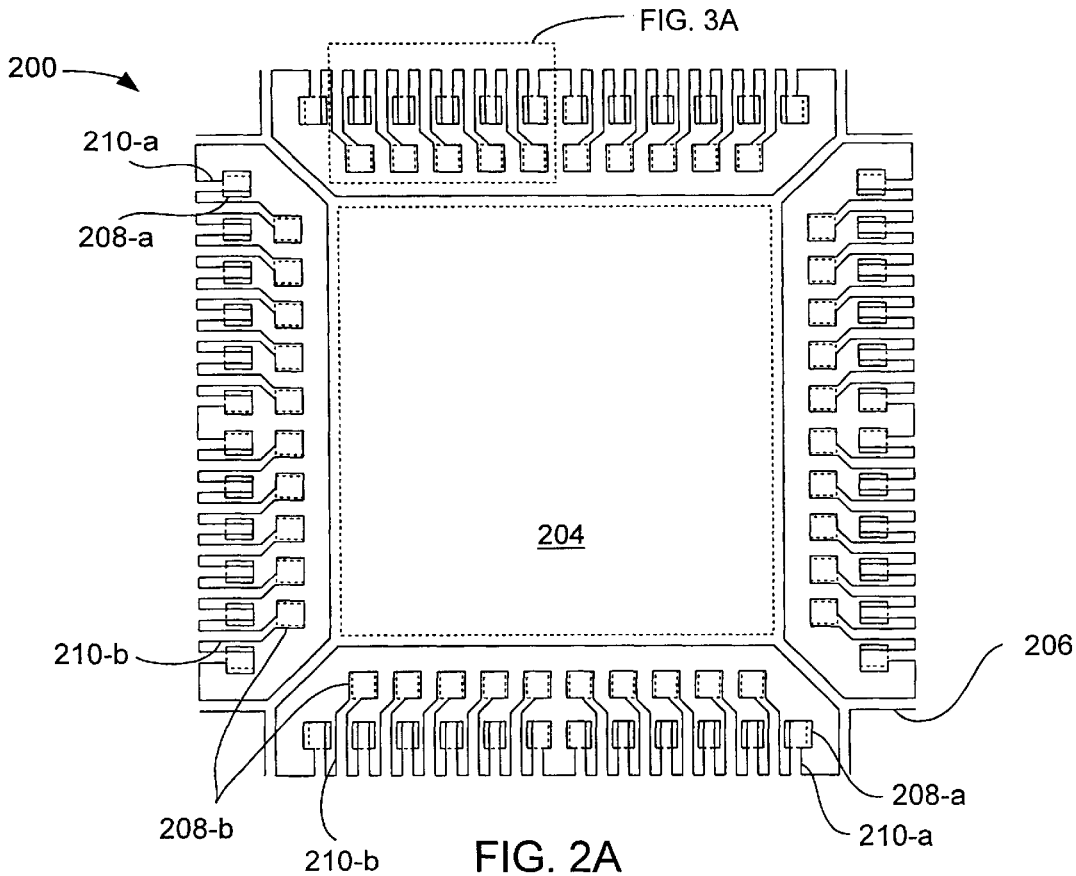
FIG. 2A illustrates a top plan view of a single device area within a leadless leadframe substrate panel as described in the present invention.
Figure 2B:
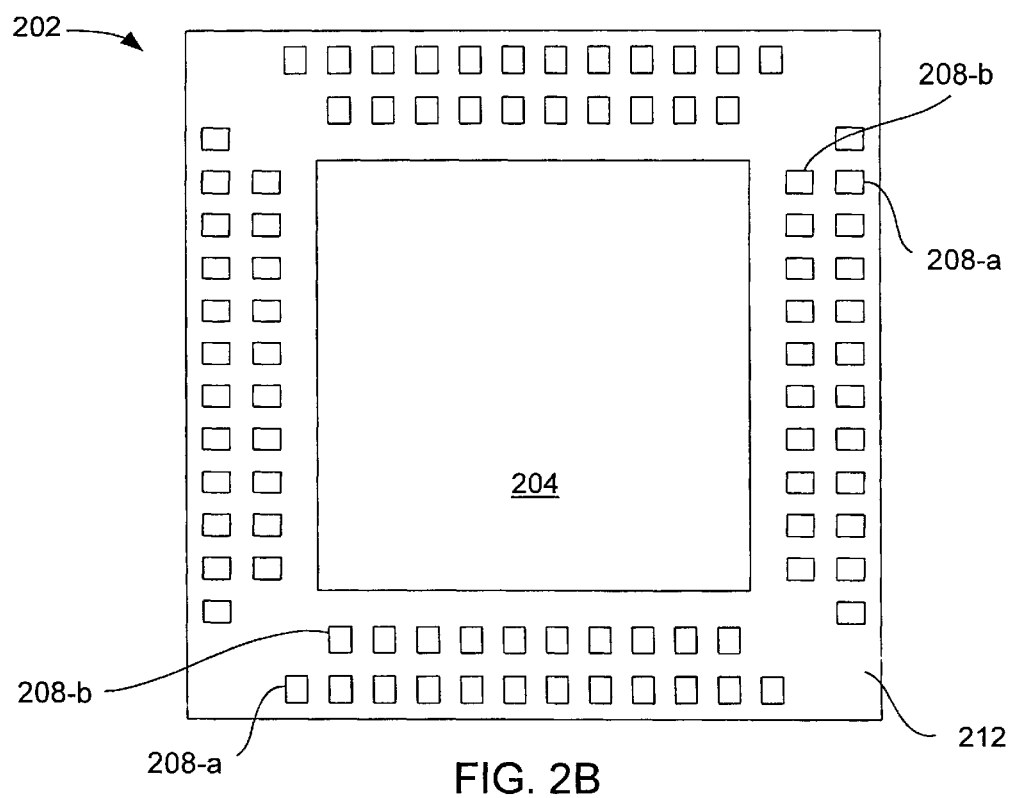
FIG. 2B illustrates a bottom plan view of a packaged leadless leadframe device formed from the substrate panel of FIG. 2A.

A description of one embodiment of the present invention begins with FIGS. 2A and 2B. FIG. 2A illustrates a plan view of the top surface of a single device area 200 of a leadless leadframe substrate panel. The device area 200 is formed according to a method of partially etching the substrate panel as will be discussed below. FIG. 2B illustrates a plan view of the bottom surface of a leadless leadframe package 202 that is formed from the device area 200 of FIG. 2A.

Referring to FIG. 2A, the device area 200 includes a die attach pad 204 that is supported by four Y-shaped tie bars 206. On the outer portions of the device area 200 is a first row of contact pads 208-*a*, which are each supported by respective tie bars or rails 210-*a*. A second row of contact pads 208-*b* is supported by tie bars or rails 210-*b* such that the contact pads 208-*b* are adjacent to the perimeter of the die attach pad 204. Each of the contact pads 208-*a* in the first row is positioned between a pair of tie bars 210-*b* of the second row. The tie bars 210-*b* are angled so that most of the contact pads 208-*b*, of the second row of contacts, are aligned with a respective contact pad 208-*a* in the first row of contact pads. In alternative embodiments, the tie bars 210-*b* may be straight, curved, or angled differently so that the contact pads 208-*b* may be positioned in various locations.

As should be appreciated by those of ordinary skill in the art, the die attach pad 204, the contact pads 208-*a* and 208-*b*, and the tie bars 210-*a* and 210-*b* are integrally formed from a metal, leadless leadframe substrate panel. It should then be appreciated that the end of the tie bars 210-*a* and 210-*b*, opposite that of the respective contact pads, are attached to portions of the leadless leadframe substrate panel. For instance, the tie bars 210-*a* and 210-*b* may extend from another tie bar. Also, the shape of the contact pads may vary depending upon the specific embodiment of the invention.

The dotted lines that appear inside of the die attach pad 204 and the contact pads 208-*a* and 208-*b* represent the respective bottom surfaces of each of the chip features. These bottom surfaces are the surfaces that will eventually be placed in contact with an electronic substrate, such as a printed circuit board. The dotted lines illustrate that in this particular embodiment, the bottom surfaces of the die attach pad 204 and the second row of contact pads 208-*b* are smaller than the respective top surfaces. This configuration is a result of the etching process and is not required by the present invention. However, this particular configuration is useful in securing the contact pads 208-*b* and the die attach pad 204 within a molding cap used to encapsulate the packaged device.

Generally, a leadless leadframe package is obtained after attaching a semiconductor die to the top surface of the die attach pad 204, electrically connecting the die to the contact pads 208-*a* and 208-*b* through bonding wires, singulating each of the device areas 200 from the substrate panel, and applying a molding cap. The bottom surface of such a leadless leadframe package 202 is illustrated in FIG. 2B. As shown, a molding material 212 surrounds the die attach pad 204, the first row of contact pads 208-*a*, and the second row of contacts 208-*b* such that the respective bottom surfaces are exposed. Leaving the surfaces of the contacts 208-*a* and 208-*b* exposed makes it possible to electrically connect the package 202 to an electronic substrate, such as a printed circuit board.

Figure 3A:
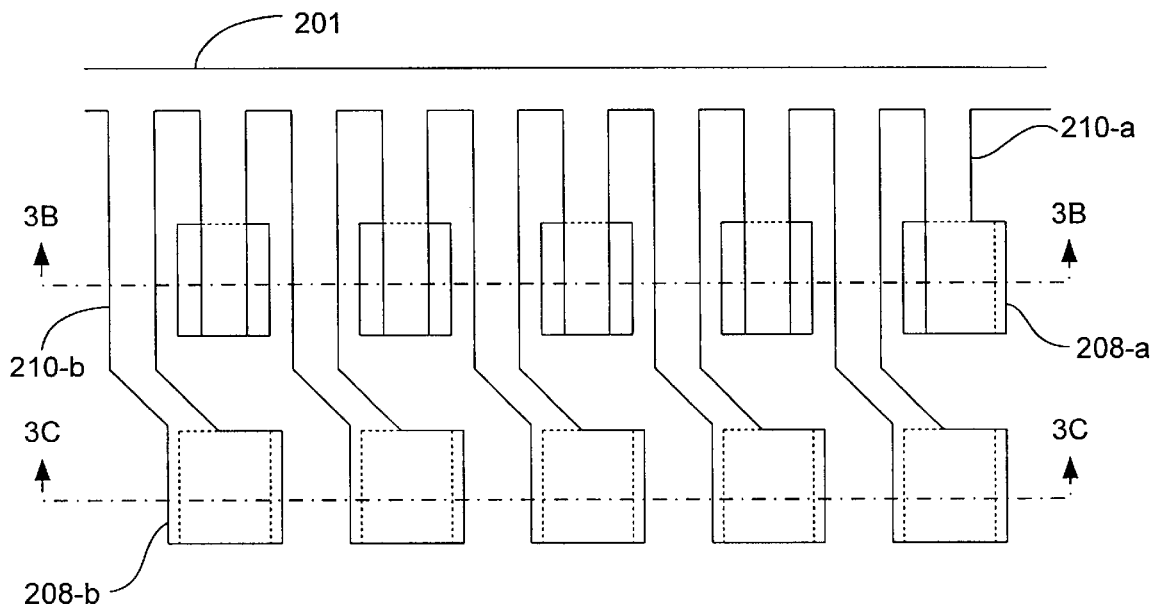
FIG. 3A illustrates an enlarged, plan view of a portion of the device area as designated in FIG. 2A.
Figure 3B:
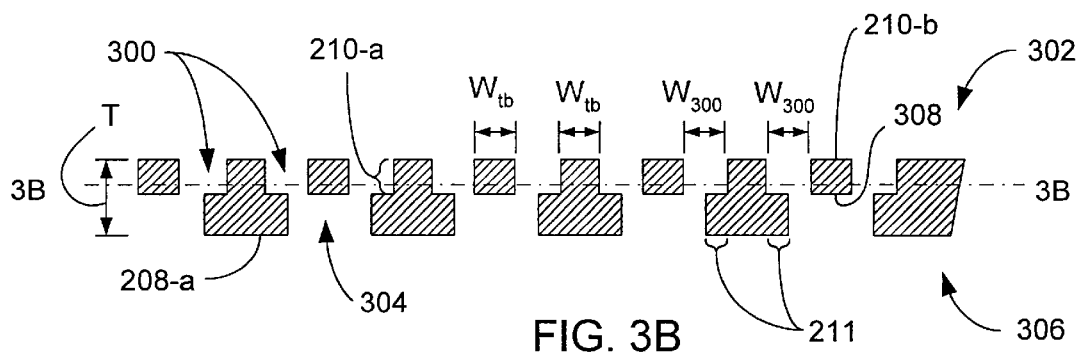
FIG. 3B illustrates a side plan, cross-sectional view of the portion of the device area of FIG. 3A along line 3B—3B.
Figure 3C:
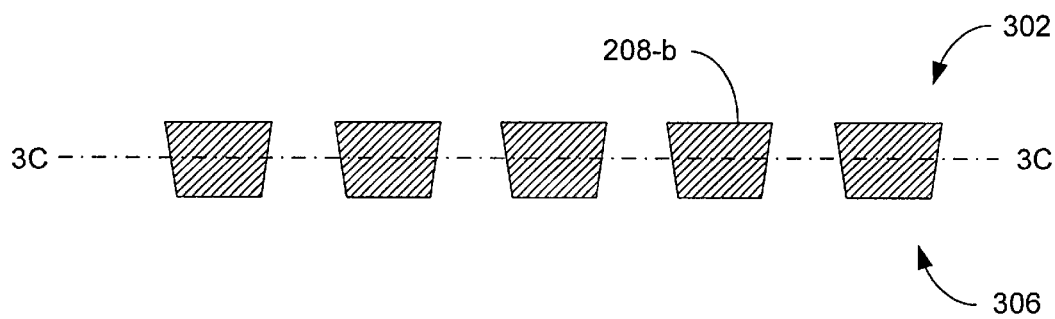
FIG. 3C illustrates a side plan, cross-sectional view of the portion of the device area of FIG. 3A along line 3C—3C.

FIGS. 3A, 3B, and 3C will now be discussed to explain the method of making, and the device area 200 of FIG. 2A in further detail. FIG. 3A illustrates an enlarged, plan view of the area designated in FIG. 2A, which includes contact pads 208-*a* and 208-*b* and tie bars 210-*a* and 210-*b* that extend from a tie bar 201. FIG. 3B illustrates a side plan, cross-sectional view along line 3B—3B, and FIG. 3C illustrates a side plan, cross-sectional view along line 3C—3C.

The method of forming the device areas 200 of the leadless leadframe substrate panel of the present invention involve partially etching both the top and bottom surfaces of the substrate panel. The etching may be performed with chemical etchants, or other methods, as is commonly known in the art. Partial etching refers to removing material from a section of a substrate panel wherein less than the entire thickness of that section is removed. For example, a shallow or a deep recess may be formed in the partially etched section of the panel. A complete passageway through the substrate panel is not created during partial etching. Partial etching may be referred to as half-etching, especially when the depth of the etched section is approximately half the thickness of the panel. Partial etching is capable of removing material within tighter size tolerances because the width of an etched section can be decreased as the depth of the etched section to be etched decreases. Therefore, by partially etching the panel from both surfaces, the tie bars 210-*a* and 210-*b* can be formed to have small separation distances from their adjacent tie bars. This in turn allows for a large number of contact pads or pins to be formed within individual leadless leadframe packages.

As can be seen in FIG. 3B, the partial etching from the top surface 302 of the panel forms recessed regions 300. Etching away the substrate material within the recessed regions 300 leaves the initial shape of the tie bars 210-*a* and 210-*b* as they extend from the tie bar 201. This etching process forms the upper half of the tie bars 210-*a*, which extend until they terminate at contact pads 208-*a*. The width of the recessed regions 300, $W_{300}$, determines the separation between each of the tie bars 210-*a* and 210-*b* and the width, $W_{tb}$, of the tie bars 210-*a* and 210-*b*.

The partial etching process from the bottom surface 306 of the substrate panel creates recessed regions 304. The material removed from regions 304 defines the shape of contacts 208-*a*, which are wider than their supporting tie bars 210-*a*. The partial etching process from the bottom surface 306 also forms the bottom half of the contacts 208-*b*, and removes substrate material to fully define the tie bars 210-*a* and 210-*b*. It is important to note that to obtain the structure illustrated, which has very tightly spaced tie bars and contact pads, the recessed regions 300 and 304 are offset from each other. The offsetting of the upper and lower recessed regions allows each of the first set of contact pads 208-*a* to be formed at a smaller distance from each of the surrounding tie bars 210-*b* as compared to when full etching processes are used. Note that full etching processes refers to etching completely through the thickness of a substrate panel from a single side.

It is also important that the partial etching from both the top surface 302 and the bottom surface 306 penetrate a sufficient depth so that each of the tie bars and contact pads are not connected to each other by substrate material. Otherwise, connection between the individual contacts and tie bars would allow for faulty electrical connections.

It should also be noted that in conventional methods, the patterning of the photolithography masks used on the top and bottom surfaces of the substrate panel to create the tie bars (or rails) and the contact pads are mirror images of each other. In contrast, in order to create the leadless leadframes according to the present invention, the masks used on the top surfaces of the substrates are different from the masks used for the bottom surfaces. By having top and bottom masks that have different patterns, the respective masks can be offset from each other and thereby form tie bars (or rails) that have small separation gaps.

As seen in FIG. 3B, the maximum thickness of the first set of contact pads 208-*a* is located near the center portion of the contact pads 208-*a* where the tie bars 210-*a* are connected to the contact pads 208-*a*. This maximum thickness, the distance from the top of the tie bars 210-*a* to the bottom surface of the contact pads 208-*a*, is equal to the thickness of the original, unetched portions of the substrate panel. It is important for at least a portion of the contacts to have a maximum thickness equal to the thickness of the substrate panel so that the shape of the tie bars and contact pads are not deformed during packaging operations such as wire bonding. The contact pads 208-*a* have outer ledges 211 that extend beyond the width of the tie bars 210-*a*. These outer ledges 211 provide the contact pads 208-*a* with larger contact surfaces. Such larger contact surfaces are beneficial in that better contact between the contact pads and the bond pads of a printed circuit board is possible. As shown in FIG. 3B, both the tie bars 210-*b* and the outer ledges 211 have a thickness that is approximately one-half the thickness, T, of the panel.

In alternative embodiments, the ratio of the thickness between the tie bars to the outer ledges 211 of the contacts may vary, so long as the tie bars 210-*a* and 210-*b* and the contact pads can be formed sufficiently close together. In some embodiments of the present invention, the ratio of the thickness of the tie bars to the thickness of the outer ledges 211 of the contact pads may range from 30–70%. Preferably, the thickness of the outer ledges 211 is approximately 50% of the thickness of the tie bars 210-*a*. The final thickness of each the outer ledges 211 and tie bars 210-*a* (and 210-*b*) will ultimately be determined by the tolerances of the etching techniques used to form the leadless leadframes.

It is noted that the sequence of partially etching from the top surface 302, then the bottom surface 306 is not critical. This sequence may be reversed or the partial etching may be simultaneously performed on both surfaces. It should be noted that the thickness of the tie bars 210-*a* can be equal to or less than the thickness of the panel so long as the tie bars 210-*a* have sufficient strength to securely support the contact pads 208-*a*. The width, $W_{tb}$, of the tie bars 210-*a* and 210-*b* are preferably minimized so that the number of tie bars within a package may be increased.

Referring to FIG. 3C, contact pads 208-*b* have a thickness equal to the thickness of the panel. Also, contact pads 208-*b* are shown to widen slightly near the top surface 302 of the substrate and narrow slightly at near the bottom surface 306 of the substrate. This specific geometry is a result of the chemically etching a slightly smaller area on the top surface 302 of the substrate and a slightly larger area on the bottom surface 306. Similarly, as seen in FIGS. 3A and 3B, the contact 208-*a* on the far right hand side has a slightly angled side surface which results in a smaller contact surface. It should be appreciated that chemical etching processes do not result in perfectly flat surfaces. Generally, since chemical etching processes use corrosive chemicals to dissolve the substrate material, the resulting surfaces are defined by the natural corrosive processes. Although, current etching processes can be controlled to result in desired leadframe geometries, there will always be slight variations that cannot be controlled. For example, it is common for chemical etching processes to leave surfaces having a slightly concave shape. Therefore, it should be recognized that the surfaces in the FIGS. of this disclosure may have the smooth surfaces as illustrated or slightly curved surfaces.

Typically, the partial etching process of the present invention produces leadless leadframe substrate panels having tie bars that are separated by a distance that is approximately 60–80% of the thickness of the panel. For instance, in FIG. 3B, the substrate panel may have a thickness, T, of approximately 6 mils (or 0.15 mm) and thereby may have tie bars that are separated by a gap, G, of approximately 0.09–0.12 mm. It should be appreciated that the separation between the tie bars, obtained by the methods of partial etching, may decrease as the etching technology improves in the near future. For leadless leadframe packages having two rows of contacts at either 0.5 mm or 0.65 mm pitch (the center-to-center distance between contact pads) within 7 by 7 mm packages, pin counts of approximately 44 through 256 can be achieved. Of course, the pin count for these packages may be increased by varying the pitch, size of the package, etc.

In alternative embodiments of the substrate panel created by the partial etching process of the present invention, more than two rows of contact pads may be formed. For instance, by creating another set of tie bars that are meshed between the tie bars 210-*a* and 210-*b*, a third set of contact pads may be positioned beyond the second row of contact pads 208-*b*.

Figure 4A:
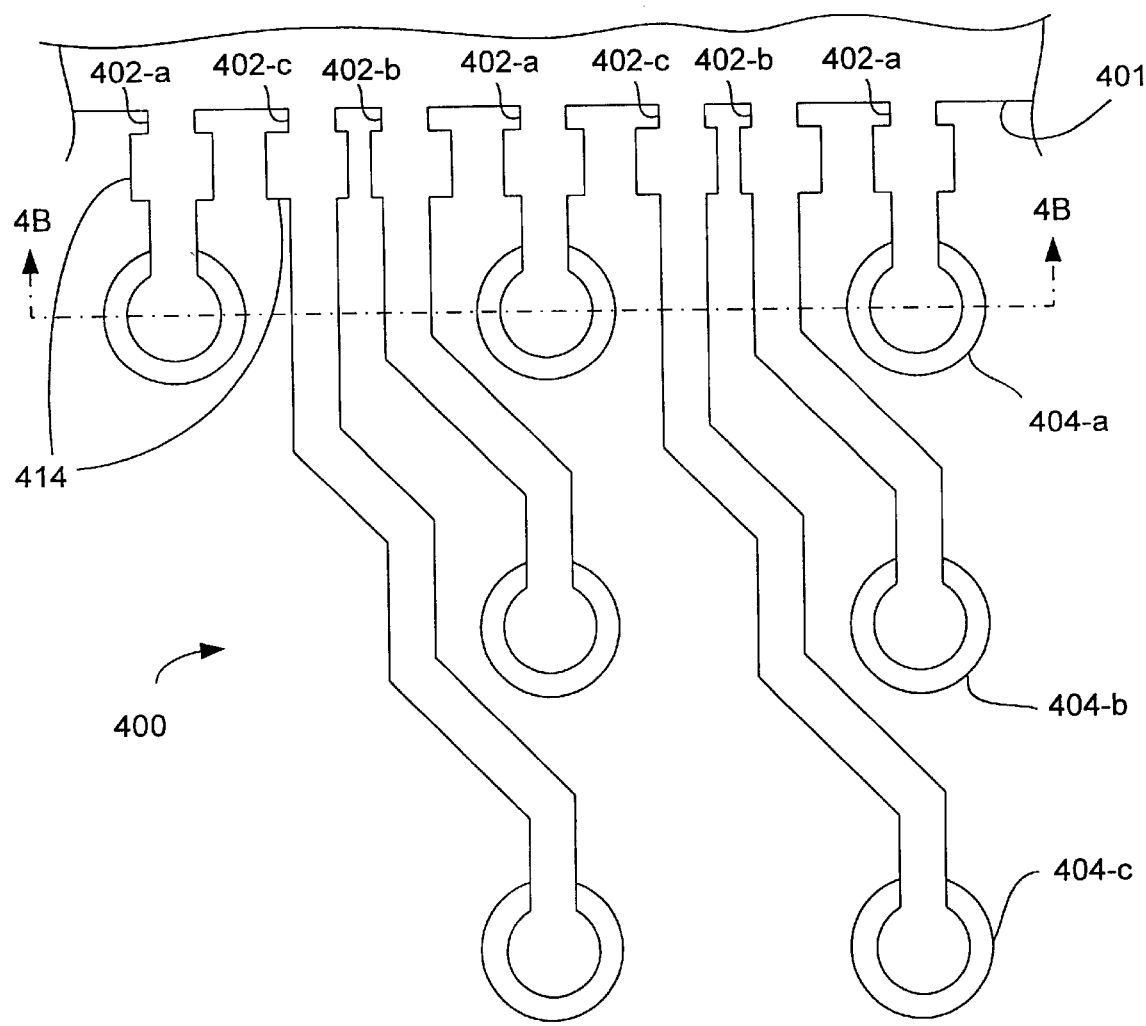
FIG. 4A illustrates a top plan view of a portion of a leadless leadframe substrate panel according to an alternative embodiment wherein alternative bonding surfaces are formed on the tie bars.
Figure 4B:
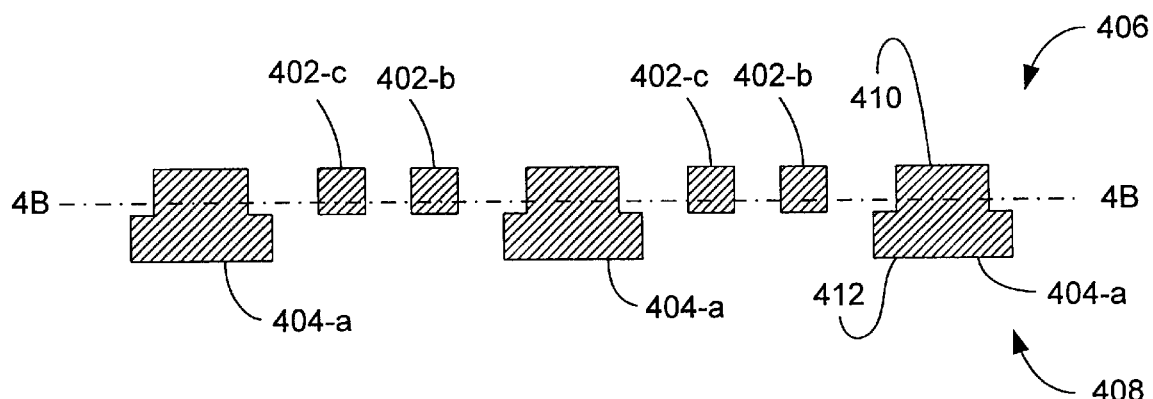
FIG. 4B illustrates a side plan, cross-sectional view of the leadless leadframe panel of FIG. 4A along line 4B—4B.

FIGS. 4A and 4B illustrate a portion of a leadless leadframe substrate panel 400 according to an alternative embodiment of the present invention. The substrate panel 400 includes three rows of contact pads. The substrate panel 400 is also formed by the partial etching process where substrate panel material is removed from both the top 406 and bottom 408 surfaces. FIG. 4A illustrates a plan view of the top surface of the panel portion 400, while FIG. 4B illustrates a side plan, cross-sectional view along line 4B—4B. This embodiment of the substrate panel 400 includes three sets of tie bars 402-*a*, 402-*b*, and 402-*c*, and the respective contact pads 404-*a*, 404-*b*, and 404-*c*. The first set of tie bars 402-*a* extend straight out from a die attach pad 401 of the substrate panel 400 and terminate with a contact pad 404*a*. The contact pad 404-*a* has a circular shape and has a diameter larger than the width of the tie bar 402-*a*. Referring to FIG. 4B, the large top surface 410 of the contact pads 404-*a* (and 404-*b* and 404-*c*), relative to the width of the tie bars 402-*a* (and 402-*b* and 402-*c*) provides more working space for bonding wires to be attached to the contact pads. As can be seen in both FIGS. 4A and 4B, the contact pads 404-*a* (and 404-*b* and 404-*c*) have diameters that are larger on the bottom surface 408 of the panel, than on the top surface 406 of the panel. As stated with respect to the embodiment of the invention shown in FIG. 3A, the larger bottom surface 412 of the contact pads 404-*a* provide a larger surface for which to connect to, for example, printed circuit boards.

A second set of tie bars 402-*b*, adjacent to the first set of tie bars 402-*a*, extend from the die attach pad 401 and angle around the first set of contact pads 404-*a* such that the first set of contact pads 404-*a* and the second set of contact pads 404-*b* are aligned. The third set of tie bars 402-*c* extend from the die attach pad 401 and angle around the second set of tie bars 402-*b* such that the third set of contact pads 404-*c* are aligned with the first and second set of contact pads 404-*a* and 404-*b*.

As seen in FIG. 4A, rectangular shaped bonding surfaces 414 are formed on each of the tie bars 402-*a*, 402-*b*, and 402-*c*. These bonding surfaces 414 are useful when the tie bars extend from die attach pads as they provide alternative surfaces upon which to attach bonding wires that connect the integrated circuit die to the contact pads. The bonding surfaces 414 provide alternative bonding surfaces to the top surfaces 410 of the contact pads 404-*a*, 404-*b*, and 404-*c*. Preferably, all the bonding surfaces 414 are equidistant from the die attach pad 401 since this simplifies the motions through which a wire bonding capillary must complete in order to carry out the wire bonding process. This in turn allows for a more efficient wire bonding process.

It is important that portion of the tie bars. 402-*a*, 402-*b* and 402-*c* that contain the bonding surfaces 414 have a thickness equal to that of the substrate panel in order to prevent deformation of the tie bars during the wire bonding process. This is important because the partially etched tie bars extend from the die attach pad 401 such that they have a vertical clearance from the bottom surface 408 of the substrate panel. Therefore, the downward pressure applied by a wire bonding capillary tip would press the bonding surface 414 portion of the tie bars downward and deform the leadless leadframe substrate panel. By forming at least the bonding surface 414 portion of the tie bars to have a thickness equal to the thickness of the panel, the tie bars resist deformation.

As should be appreciated, the tie bars 402-*a*, 402-*b*, and 402-*c* must be separated from the die attach pad 401 before the packaged device can be operational. This is accomplished by passing a saw blade across the tie bars, between the die attach pad 401 and the bonding surfaces 414, at a depth sufficiently deep to cut through the tie bars. It should also be noted that the bonding surfaces can be a variety of shapes including circular, square, or any other shape upon which a wire can be attached.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A leadless leadframe panel that has a bottom surface and an opposing top surface, a distance between the bottom surface and the top surface being a thickness of said panel, said panel also having multiple rows of contact pads, comprising:

a first set of tie bars;

a first set of contact pads, wherein each contact pad of said first set is connected to a respective one of the tie bars of said first set of tie bars, said contact pads of said first set having a contact surface that is coplanar with the bottom surface of said panel, a first maximum thickness of each of said first set of contact pads being equal to the thickness of said panel, wherein the first maximum thickness is attained where each tie bar of the first set of tie bars is connected to each contact pad of the first set of contact pads;

a second set of tie bars, the tie bars of said first and second set being in parallel formation and the tie bars of said first and second set being formed in an alternating formation, each of said second set of tie bars has a thickness that is less than the thickness of said panel, said first and second set of tie bars being aligned with the top surface of said panel; and a second set of contact pads, wherein each contact pad of said second set is connected to a respective one of the tie bars of said second set of tie bars, the contact surfaces of said second set of contact pads being in the same plane as the bottom surface of said panel, and a second maximum thickness of each of said second set of contact pads being equal to the thickness of said panel, wherein the second maximum thickness is attained where each tie bar of the second set of tie bars is connected to each contact pad of the second set of contact pads.

2. A leadless leadframe panel as recited in claim 1 wherein said first set of contact pads have outer ledges, each of said outer ledges having a thickness that is less than the thickness of the substrate panel.

3. A leadless leadframe panel as recited in claim 1 wherein said second set of tie bars has a thickness that is approximately one-half of the thickness of said panel.

4. A leadless leadframe panel as recited in claim 1 wherein each of said first set of contact pads are aligned in a first row and each of said second set of contact pads are aligned in a second row.

5. A leadless leadframe panel as recited in claim 1 wherein each of said second set of tie bars is angled such that each of the contacts of said second set are aligned with a respective contact of said first set of contacts.

6. A leadless leadframe panel as recited in claim 1 further comprising a third set of tie bars and a third set of contact pads, each of said third set of contact pads being connected to a respective tie bar of said third set of tie bars, each tie bar of said third set of tie bars having opposing sides, one of the opposing sides being adjacent to a tie bar of the first set and the other opposing side being adjacent to a tie bar of the second set.

7. A leadless leadframe panel as recited in claim 1 wherein the contact surfaces of said first and second sets of contact surfaces have a shape selected from the group of shapes consisting of circular, rectangular, or square.

8. A leadframe panel for manufacturing packaged semiconductor devices comprising:

at least one row of elongated tie bars that are spaced closely next to each other wherein each of the tie bars have a length, width, and a thickness, wherein at least a lengthwise portion of each of the tie bars are parallel to each other, and wherein every other tie bar is a thin tie bar and the tie bars between each thin tie bar are thick tie bars, at least a portion of each thin tie bar having a thickness that is less than the thickness of the thick tie bars.

9. A leadframe panel as recited in claim 8 wherein each of the tie bars have a top surface and the top surfaces of each of the tie bars are substantially co-planar.

10. A leadframe panel as recited in claim 8 wherein the widths of each of the tie bars are substantially equal.

11. A leadframe panel as recited in claim 8 wherein each of the thin tie bars are longer than the thick tie bars.

12. A leadframe panel as recited in claim 11 wherein the thick tie bars have opposing side surfaces, each of the thick tie bars further comprising:

ledges that extend from a portion of each side surface wherein a bottom surface of each ledge and a bottom surface of the respective thick tie bar form a contact surface suitable for making contact with an external electrical device, wherein the bottom surfaces of the ledges and the thick tie bars are coplanar.

13. A leadframe panel as recited in claim 12 wherein each of the ledges have a ledge thickness that is less than the thickness of the thick tie bars from which the ledges extend.

14. A leadframe panel as recited in claim 12 wherein each of the thin tie bars have a bottom surface, each of the thin tie bars further comprising:

a contact pad that is attached to the bottom surface of an associated thin tie bar, the contact pad having a bottom surface that is coplanar with the contact surface of each thick tie bar.

15. A leadframe panel as recited in claim 14 wherein a thickness of at least one of the contact pads plus the thickness of an associated thin tie bar is substantially equal to the thickness of a thick tie bar.

16. A leadframe panel as recited in claim 14 wherein the contact pads of each thin tie bar are aligned substantially along a common axis.

17. A leadframe panel as recited in claim 14 further comprising:

a die attach pad that is located proximate to the contact pads of the thin tie bars.

18. A leadframe panel as recited in claim 17 wherein each of the thick tie bars lie substantially perpendicularly with an edge of the die attach pad.

19. A leadframe panel as recited in claim 17 wherein there are at least four rows of elongated tie bars such that each row is located proximate to a respective edge of the die attach pad.

20. A leadframe panel as recited in claim 8 further comprising:

a die attach pad, wherein the tie bars are integrally formed with and extend from the die attach pad.

21. A leadframe panel as recited in claim 8 wherein the tie bars bend in directions that are only within the plane within which the tie bars lie.

\* \* \* \* \*